United States Patent
Noguchi et al.

(10) Patent No.: US 7,914,883 B2
(45) Date of Patent: Mar. 29, 2011

(54) TRANSPARENT CONDUCTIVE LAMINATED BODY

(75) Inventors: Tomonori Noguchi, Ibaraki (JP); Hideo Sugawara, Ibaraki (JP); Tomotake Nashiki, Ibaraki (JP); Hidetoshi Yoshitake, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 1327 days.

(21) Appl. No.: 11/448,660

(22) Filed: Jun. 8, 2006

(65) Prior Publication Data
US 2006/0290409 A1 Dec. 28, 2006

(30) Foreign Application Priority Data

Jun. 13, 2005 (JP) .................. 2005-172178

(51) Int. Cl.
B32B 27/32 (2006.01)
B32B 9/04 (2006.01)
B32B 9/00 (2006.01)
B32B 19/00 (2006.01)
(52) U.S. Cl. ............... 428/220; 428/411.1; 428/332; 428/688; 428/689; 428/697
(58) Field of Classification Search .............. None
See application file for complete search history.

(56) References Cited

FOREIGN PATENT DOCUMENTS

| | | | |
|---|---|---|---|
| JP | 6-222352 | A | 8/1994 |
| JP | 2000-301648 | A | 10/2000 |
| JP | 2002-326301 | A | 11/2002 |

OTHER PUBLICATIONS

A. Nakamura et al. Extended Abstracts (67$^{th}$ Autumn Meeting, 2006); The Japan Society of Applied Physics No. 1.
Kanazawa I. T. et al. Extended Abstracts (67$^{th}$ Autumn Meeting, 2006); The Japan Society of Applied Physics No. 1.

*Primary Examiner* — Sheeba Ahmed
(74) *Attorney, Agent, or Firm* — Westerman, Hattori, Daniels & Adrian, LLP

(57) ABSTRACT

A transparent conductive laminated body comprising: a transparent film substrate having a thickness of 2 to 200 μm, and a first transparent dielectric thin film, a second transparent dielectric thin film and a transparent conductive thin film that are formed on one side of the substrate in this order from the side of the substrate, wherein the first transparent dielectric thin film is formed by vacuum deposition, sputtering or ion plating and comprises a complex oxide containing 0 to 20 parts by weight of tin oxide and 10 to 40 parts by weight of cerium oxide relative to 100 parts by weight of indium oxide, and the relationship: $n2 < n3 \leq n1$ is satisfied, where $n1$ is the refractive index of the first transparent dielectric thin film, $n2$ is the refractive index of the second transparent dielectric thin film, and $n3$ is the refractive index of the transparent conductive thin film, suppresses coloration of transmitted light and is produced with high productivity.

5 Claims, 1 Drawing Sheet

TRANSPARENT CONDUCTIVE LAMINATED BODY

BACKGROUND OF THE INVENTION

1. Field of the Invention

The present invention relates to a transparent conductive laminated body, which is transparent in visible light region, having a conductive thin film on a film substrate. The transparent conductive laminated body of the present invention is used in usages of transparent electrodes for new display methods applied liquid crystal displays, and electroluminescence displays and touch panels etc. besides and antistatic and electromagnetic wave interception, etc. for transparent goods

2. Description of the Prior Art

As a conventional transparent conductive thin film, a so-called conductive glass in which indium oxide thin film is formed on a glass plate is known well, but since a substrate is made of glass, the conductive glass is inferior in flexibility and workability, and it is not suitable for a certain usage. Therefore, in recent years, a transparent conductive thin film in which various kinds of plastic films including polyethylene terephthalate film is used as substrate are often used in the light of advantages, such as, a flexibility and workability etc. in addition to excellent shock resistance and lightweight.

However, transparent conductive thin films using the film substrate have a problem that transparency is decreased because of a large light reflection factor on surface thereof, and also have a problem that electric resistance is increased or disconnection of circuits may occur because of blemish given while in use since the conductive thin film is inferior in abrasion property. Especially in conductive thin films for touch panels, a pair of films facing countered to each other through a spacer are strongly contacted at depressed dots from the panel plate side of one of the pair, and therefore it is required for the films to have excellent durable characteristics resisting a strong depressing impact, that is, dotting property. However, since an excellent dotting property was not realized in the transparent conductive thin films using the above described film substrate, the films had a problem that only a short life as a touch panel could be realized.

In Japanese Patent Application Laid-Open (JP-A) No.6-222352 A, as a solution for the above described problem, a method of obtaining a transparent conductive laminated body is proposed in which a film with a specific film thickness is used as a film substrate, and onto one face of the film a thin film of dielectric substance with a light index of refraction smaller than a light index of refraction of the film substrate is formed, and further a transparent conductive thin film is sequentially formed thereon, and moreover onto the other face of the film substrate another transparent substrate is adhered through a transparent pressure sensitive adhesive layer. In this transparent conductive laminated body, while transparency and abrasion property of the conductive thin film are improved, dotting property as a material for touch panels is also improved.

There is also proposed a transparent conductive laminated body comprising a transparent film substrate, and a first transparent dielectric thin film, a second transparent dielectric thin film and a transparent conductive thin film that are formed on one side of the substrate in this order from the side of the substrate, wherein the laminate satisfies the relationship: the refractive index of the second transparent dielectric thin film<the refractive index of the film substrate≦the refractive index of the first transparent dielectric thin film<the refractive index of the transparent conductive thin film (see Japanese Patent Application Laid-Open (JP-A) No. 2002-326301).

This transparent conductive laminated body can form a touch panel that shows improved dotting property when used in a bended form. According to Japanese Patent Application Laid-Open (JP-A) No. 2002-326301, however, a mixture of organic and inorganic materials is used for the first transparent dielectric thin film formed on the transparent film substrate, and thus it is not easy to adjust the optical properties such as transparency. There is also proposed a transparent conductive laminated body comprising a transparent film substrate, and a first transparent dielectric thin film, a second transparent dielectric thin film and a transparent conductive thin film that are formed on one side of the substrate in this order from the side of the substrate, wherein the laminate satisfies the relationship: the second transparent dielectric thin film<the transparent conductive thin film≦the first transparent dielectric thin film (see Japanese Patent Application Laid-Open (JP-A) No. 2000-301648). This transparent conductive laminated body is reported to be able to suppress coloration of transmitted light. Japanese Patent Application Laid-Open (JP-A) No. 2000-301648 discloses various methods for forming the first transparent dielectric thin film on the transparent film substrate, but none of the methods has a sufficient rate of film production.

SUMMARY OF THE INVENTION

It is an object of the invention to provide a transparent conductive laminated body that comprises a transparent film substrate, and a first transparent dielectric thin film, a second transparent dielectric thin film and a transparent conductive thin film formed on one side of the substrate in this order from the side of the substrate and that suppresses coloration of transmitted light and is produced with high productivity and to provide a method for producing such a transparent conductive laminated body. It is another object of the invention to provide a touch panel using such a transparent conductive laminated body.

The inventors have made active investigations to solve the above problems and consequently have found that the above objects can be achieved with the transparent conductive laminated body as described below to complete the invention.

That is, the present invention relates to a transparent conductive laminated body, comprising: a transparent film substrate having a thickness of 2 to 200 μm, and a first transparent dielectric thin film, a second transparent dielectric thin film and a transparent conductive thin film that are formed on one side of the substrate in this order from the side of the substrate, wherein the first transparent dielectric thin film is formed by vacuum deposition, sputtering or ion plating and comprises a complex oxide containing 0 to 20 parts by weight of tin oxide and 10 to 40 parts by weight of cerium oxide relative to 100 parts by weight of indium oxide, and the relationship: $n2<n3 \leqq n1$ is satisfied, where $n1$ is the refractive index of the first transparent dielectric thin film, $n2$ is the refractive index of the second transparent dielectric thin film, and $n3$ is the refractive index of the transparent conductive thin film.

In the above described transparent conductive laminated body, it is preferable that the first transparent dielectric thin film has a thickness of 10 to 200 nm and a surface electrical resistance of $1 \times 10^6$ Ω/square or more.

In the above described transparent conductive laminated body, it is preferable to use a transparent conductive laminated body further comprising a transparent substrate that is bonded by a transparent pressure-sensitive adhesive layer to another side of the transparent film substrate.

The present invention also relates to a method for producing a transparent conductive laminated body, comprising:

forming a first transparent dielectric thin film, a second transparent dielectric thin film and a transparent conductive thin film on one side of a transparent film substrate having a thickness of 2 to 200 μm in this order from the side of the substrate, wherein the first transparent dielectric thin film is formed by vacuum deposition, sputtering or ion plating and comprises a complex oxide containing 0 to 20 parts by weight of tin oxide and 10 to 40 parts by weight of cerium oxide relative to 100 parts by weight of indium oxide, and the relationship: n2<n3≦n1 is satisfied, where n1 is the refractive index of the first transparent dielectric thin film, n2 is the refractive index of the second transparent dielectric thin film, and n3 is the refractive index of the transparent conductive thin film.

In the above described method, it is preferable that the first transparent dielectric thin film has a thickness of 10 to 200 nm and a surface electrical resistance of $1\times10^6$ Ω/square or more.

The present invention further relates to a touch panel, comprising;

a pair of panel plates each having a transparent conductive thin film; and a spacer through which the pair of the panel plates are opposed to each other in such a manner that the transparent conductive thin films are opposed to each other, wherein at least one of the panel plates comprises the above described transparent conductive laminated body.

According to the invention, the first transparent dielectric thin film is made of a complex oxide that contains indium oxide and specific amounts of tin oxide and cerium oxide based on the amount of the indium oxide. The complex oxide comprises a complex of indium oxide and tin oxide, which is a transparent conductive material, and cerium oxide with which the complex is added. Such a complex material can achieve a high refractive index equal to or higher than the refractive index of the transparent conductive thin film. This leads to a large difference between the refractive indexes of the first and second transparent dielectric thin films so that the optical adjustment can easily be performed and that a transparent conductive laminated body with good optical properties such as good transparency can be achieved.

The first transparent dielectric thin film made of the complex oxide according to the invention has high surface electrical resistance and can be adjusted so as to have a high resistance value that will not affect the electrical conductivity of the transparent conductive thin film. The surface electrical resistance of the first transparent dielectric thin film preferably provides insulating properties (high resistance values) in such a manner that the electrical conductivity of the transparent conductive thin film is not affected. The surface electrical resistance of the first transparent dielectric thin film is preferably $1\times10^6$ Ω/square or more, further preferably $1\times10^8$ Ω/square or more.

The complex oxide according to the invention has high refractive index, and thin films thereof can be produced with high productivity (at high sputtering rate) by sputtering, which is commonly employed to form thin films. Examples of high refractive index materials that are conventionally used include $TiO_2$ (2.35), $Nd_2O_3$ (2.15), $ZrO_2$ (2.05), $Ta_2O_5$ (2.2), ZnO (2.1), $In_2O_3$ (2.0), and $SnO_2$ (2.0), wherein values in parentheses are the light refractive indices of the respective materials. Among these materials, however, thin films of $TiO_2$, $Nd_2O_3$, $ZrO_2$, $Ta_2O_5$, ZnO, or the like are produced with low productivity (at low sputtering rate) by sputtering, which is commonly employed to form thin films. Thin films of $In_2O_3$, $SnO_2$ or the like are produced with high productivity, but they have low surface electrical resistance values and affect the electrical conductivity of the transparent conductive thin film and thus are not suited for the first transparent dielectric thin film.

The transparent conductive laminated body of the invention has two transparent dielectric thin layers including the first and second transparent dielectric thin films between the transparent conductive thin film and the film substrate. Such a structure also has good abrasion resistance and good bending properties. In addition, the first transparent dielectric thin film uses a high-refractive-index, high-resistance complex oxide having a specific content of a specific component and is formed by a dry process, as described above. Therefore, the first transparent dielectric thin film can suppress coloration of transmitted light, be produced with high productivity and be easily adjusted in optical properties.

Figure 1:
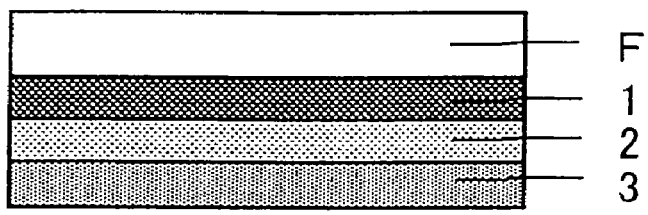
FIG. 1 is a cross-sectional view showing an example of the transparent conductive laminated body of the invention.

In the drawings, the reference character F represents a film substrate, 1 a first transparent dielectric thin film, 2 a second transparent dielectric thin film, 3 a transparent conductive thin film, A a pressure-sensitive adhesive layer, and T a transparent substrate, respectively.

DESCRIPTION OF THE PREFERRED EXAMPLES

The transparent conductive laminated body of the invention will be described below with reference to the drawings. FIG. 1 shows an example of the transparent conductive laminated body of the invention, which includes a transparent film substrate F, a first transparent dielectric thin film 1 and a second transparent dielectric thin film 2 formed on one side of the substrate F, and a transparent conductive thin film 3 formed on the second transparent dielectric thin film 2.

Figure 2:
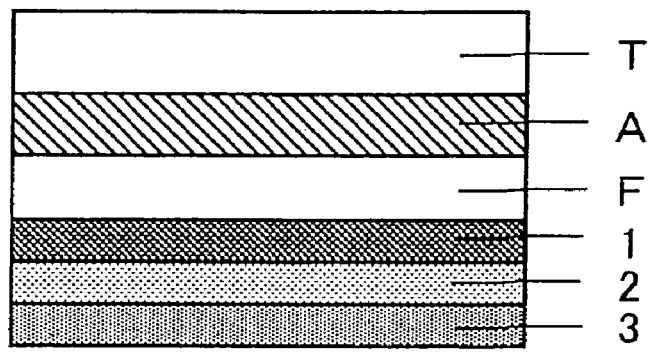
FIG. 2 is a cross-sectional view showing another example of the transparent conductive laminated body of the invention.

FIG. 2 shows an example where a transparent substrate T is bonded by a transparent pressure-sensitive adhesive layer A to the other side of the film substrate F of the transparent conductive laminated body as shown in FIG. 1. Although not shown, a hard-coating layer or the like may be provided on the outer surface of the transparent substrate T in FIG. 2.

Especially as film substrate F used in the present invention, there is no limitation, and various kinds of plastic films with transparency may be used. For example, as material, polyester derived resins, acetate derived resins, polyether sulfone derived resins, polycarbonate derived resins, polyamide derived resins, polyimide derived resins, polyolefin derived resins, (meth)acrylics derived resins, polyvinyl chloride derived resins, polyvinylidene chloride derived resins, polystyrene derived resins, polyvinyl alcohol derived resins, polyarylate derived resins, polyphenylene sulfide derived resins, etc. may be mentioned. A light index of refraction n1 of a film substrate F is preferably about 1.4 to 1.7.

These film substrates F each have a thickness in the range of 2 to 200 μm, particularly in the range of 20 to 150 μm. If the thickness is less than 2 μm, the substrate can have inadequate mechanical strength, and it can be difficult to use the substrate in the form of a roll for continuous production of the first or second transparent dielectric thin film and the transparent conductive thin film and optionally the pressure-sensitive adhesive layer. A thickness of more than 200 μm is not preferred in view of commercial needs such as lightweight and small thickness.

Etching processing, such as sputtering, corona discharging, flame processing, ultraviolet rays irradiation, electron ray irradiation, chemical conversion coating, oxidation, etc., hardcoat processing and undercoat processing may be performed to the surface of the above described film substrate F beforehand in order to improve adhesion to the above described substrate of the first dielectric substance thin film 1 that is to be prepared thereon. Moreover, before forming the first dielectric substance thin film 1, dust removing and cleaning processing may be performed by solvent cleaning, ultrasonic cleaning etc., if needed.

The first transparent dielectric thin film 1, the second transparent dielectric thin film 2 and the transparent conductive thin film 3 are formed in this order on the film substrate F. The light refractive index n1 of the first transparent dielectric thin film 1, the light refractive index n2 of the second transparent dielectric thin film 2, and the light refractive index n3 of the transparent conductive thin film 3 satisfy the relationship: n2<n3≦n1. The light refractive index n3 of the transparent conductive thin film 3 is generally about 2 (typically from 1.9 to 2.1), and therefore in such a case, the light refractive index n1 of the first transparent dielectric thin film 1 is generally from about 1.9 to about 2.3, preferably from 2.0 to 2.2, and the light refractive index n2 of the second transparent dielectric thin film 2 is generally from about 1.3 to about 1.7, preferably from 1.4 to 1.6.

The first transparent dielectric thin film 1 is made of the complex oxide that contains indium oxide and specific amounts of tin oxide and cerium oxide based on 100 parts by weight of the indium oxide. A sintered body of a mixture of the respective oxide components is preferably used as a material for forming the thin film 1. In the complex oxide, the content of tin oxide is from 0 to 20 parts by weight, preferably from 3 to 15 parts by weight, based on 100 parts by weight of indium oxide, in view of optical properties. If the content of tin oxide is more than 20 parts by weight, the sintered body for use as the material for forming the thin film can have low sintered density so that discharge can hardly remain stable during the film production, that is, the discharge stability can be poor. The content of cerium oxide is from 10 to 40 parts by weight, preferably from 15 to 30 parts by weight, based on 100 parts by weight of indium oxide, in view of high resistance (insulating properties) and optical properties. A cerium oxide content of less than 10 parts by weight is not preferred, because in such a case, the surface electrical resistance of the first transparent dielectric thin film 1 can be so low that it can have conductivity. A cerium oxide content of more than 40 parts by weight is not preferred because in such a case, the productivity (sputtering rate for film production) can be reduced.

A thickness of the first transparent dielectric thin film 1 is not limited; the thickness is preferably of 10 to 200 nm, more preferably of 15 to 60 nm. With a thickness of less than 10 nm, it can be difficult to produce the film in the form of a continuous coating. The thickness is preferably 200 nm or more in view of optical adjustment.

As material of the transparent dielectric thin film 2, for example, inorganic substances [numerical values in ( ) of each material represents a light refractive index], such as; NaF (1.3), Na$_3$AlF$_6$ (1.35), LiF (1.36), MgF$_2$ (1.38), CaF$_2$ (1.4), BaF$_2$ (1.3), SiO$_2$ (1.46), LaF$_3$ (1.55), CeF$_3$ (1.63), Al$_2$O$_3$ (1.63); and organic substances having about 1.4 to 1.6 of the index of refraction, such as acrylics derived resins, urethane derived resins, siloxane derived polymers, alkyd resins, and melamine resins may be mentioned. A suitable material is chosen out of these materials, and is used independently, or two or more of them are used in combination to form the transparent dielectric thin film 2 satisfying the above described index of refraction n2.

A thickness of the second transparent dielectric thin film 2 is not limited; the thickness is preferably of 10 nm or more, more preferably of 10 to 300 nm, particularly preferably of 20 to 120 nm, in terms of producing the film in the form of a continuous coating and in terms of improving transparency or abrasion resistance. If the total thickness of the first transparent dielectric thin film 1 and the second transparent dielectric thin film 2 is too large, an improvement in transparency cannot be expected, and cracking can occur. Thus, the total thickness is preferably 150 nm or less, more preferably 100 nm or less.

While any material may be used for the transparent conductive thin film 3, for example, indium oxide containing tin oxide, tin oxide containing antimony, or the like is preferably used as the material for the thin film 3.

A thickness of the transparent conductive thin film 3 is not limited; the thickness is preferably of 10 nm or more in terms of producing the film in the form of a continuous coating, which has a surface electrical resistance of 1×10$^3$ Ω/square or more and good electrical conductivity. If the thickness of the film is too large, the transparency and the like can be reduced, and thus the thickness is preferably from about 10 to about 300 nm.

The first transparent dielectric thin film 1, the second transparent dielectric thin film 2 and the transparent conductive thin film 3 are generally formed in this order sequentially on the film substrate F. Examples of the methods for forming the first transparent dielectric thin film 1 and the transparent conductive thin film 3 include vacuum vapor deposition methods, sputtering methods, and ion plating methods. Any appropriate method may be employed depending on the type of the materials and the desired film thickness. In particular, sputtering methods are typically used. The second transparent dielectric thin film 2 may be formed by any of the above methods or any other methods such as coating methods.

The transparent substrate T may be bonded by the transparent pressure-sensitive adhesive layer A to the other side of the film substrate F on which the first transparent dielectric thin film 1, the second transparent dielectric thin film 2 and the transparent conductive thin film 3 are sequentially formed as described above. The bonding of the transparent substrate T may be performed by a process including the steps of forming the pressure-sensitive adhesive layer A on the transparent substrate T and bonding the film substrate F thereto or by a process including the steps of forming the pressure-sensitive adhesive layer A contrarily on the film substrate F and bonding the transparent substrate T thereto. The latter process is more advantageous in terms of productivity, because it enables continuous production of the pressure-sensitive adhesive layer A with the film substrate F in the form of a roll.

As a pressure sensitive adhesive layer A, if it has transparency, especially it will not be limited, and, for example, acrylics derived pressure sensitive adhesives, silicone derived pressure sensitive adhesives, rubber derived pressure sensitive adhesives, etc. may be used. This pressure sensitive adhesive layer A has a function improving abrasion property and dotting property as touch panels of the transparent conductive thin film 3 that is prepared on one face of the film substrate F by cushioning effect after the transparent substrate T is adhered. In order to obtain better demonstration of this function, an elastic modulus is preferably set in a range of 1 to 100 N/cm$^2$, and a thickness is set no less than 1 μm, and usually in a range of 5 to 100 μm.

The transparent substrate T bonded by the pressure sensitive adhesive layer A gives a good mechanical strength to the film substrate F, and especially it contributes to prevention of curling etc. When it is required that it should have a flexibility after adhered, a plastic film with a thickness about 6 to 300 μm is usually used, and when especially a flexibility is not required, a glass plate and plastics in a shape of a film and a plate with thickness of approximately 0.05 to 10 mm are usually used. As material of plastics, the same material as the above mentioned film substrate may be mentioned.

Moreover, if needed, an antiglare processed layer and an antireflection processed layer aiming at improvement in visibility may be prepared or a hard coat processed layer aiming at protection of an outer face may be formed on an outer face (a face opposite to a pressure sensitive adhesive layer side) of the above described transparent substrate T. As hard coat processed layer, curable coat comprising curable type resins, such as melanin derived resins, urethane derived resins, alkyd derived resins, acrylics derived resins, and silicon derived resins, may be used preferably.

Figure 3:
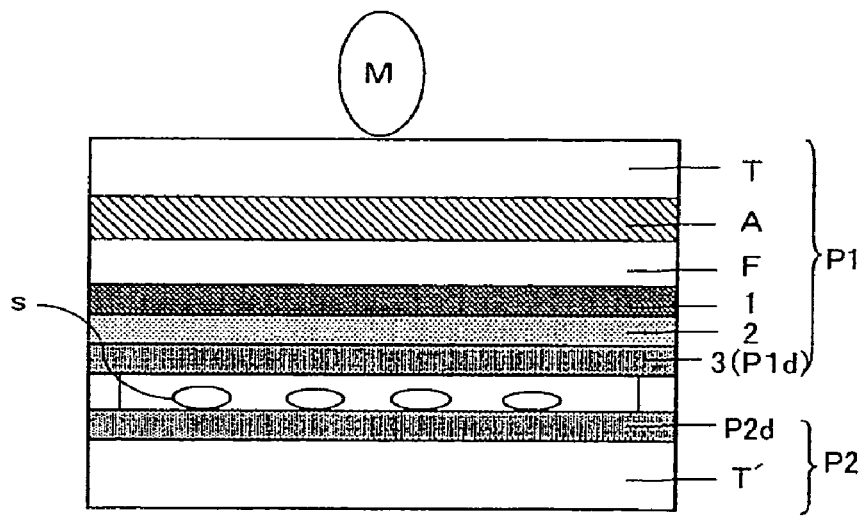
FIG. 3 is a cross-sectional view showing an example of the tough panel of the invention.

FIG. 3 shows an example of a touch panel using a transparent conductive laminated body (FIG. 2) of the above described present invention. In a touch panel, a pair of panel plates P1 and P2 having transparent conductive thin films P1d and P2d are opposed to each other through a spacer S in such a manner that the transparent conductive thin films P1d and P2d currently formed in a shape of lines that mutually orthogonal face countered to each other, the transparent conductive laminated body shown in above described FIG. 2 is used as one panel plate P1.

This touch panel serves as a transparent switching body structure having a function in which a pressure applied from the panel plate P1 side with an input pen M against an elastic force of spacer S has the conductive thin films P1d and P2d contact each other to put an electrical circuit in a state of ON, and if the above described pressure applied is canceled, the electrical circuit is made to return to an original OFF state. In this case, since the panel plate P1 is made from the above described transparent conductive laminated body, it has an outstanding abrasion property and outstanding dotting property as a conductive thin film, and thus the above described function can be stably maintained over a long period of time.

In addition, in FIG. 3, the panel plate P1 may be a transparent conductive laminated body shown in FIG. 1. Moreover, in the panel plate P2, the conductive thin film P2d is prepared on the transparent substrate T' comprising plastic film or a glass plate, etc., and the same transparent conductive laminated body as the above described panel plate P1 shown in FIG. 1 or FIG. 2 may be used.

EXAMPLES

The invention will be more specifically described in the examples below. In the following description, "part or parts" means part or parts by weight.

Refractive Index and Thickness of Each Layer

The refractive index and thickness of each of the transparent dielectric thin films and the transparent conductive thin film were calculated by optical simulation which included laminating a single layer under the corresponding conditions on an appropriate thermoplastic film substrate different in refractive index from the transparent dielectric thin film or the transparent conductive thin film, measuring the optical reflection spectrum on the surface of the laminated layer, determining the wavelength for the maximum or minimum reflectance peak that was produced on the spectrum based on optical interference effect, and using the wavelength and the value of the peak reflectance for the calculation. The refractive index of the hard-coating layer was measured with an Abbe refractometer (at a measurement wavelength of 590 nm), and the thickness of the hard-coating layer was calculated using the optical interference method similarly to the case of the transparent dielectric thin film. The surface electrical resistance (Ω/square) of the first transparent dielectric thin film was measured with a Highrester resistance meter manufactured by Mitsubishi Chemical Co., Ltd., and the thickness of the first transparent dielectric thin film was measured with a transmission electron microscope H-7650 manufactured by Hitachi, Ltd.

Example 1

(Production of First Transparent Dielectric Thin Film)

A first transparent dielectric thin film (with a light refractive index n1 of 2.1) of a complex oxide containing 100 parts of indium oxide, 10 parts of tin oxide and 25 parts of cerium oxide was formed by a reactive sputtering method under the conditions below and a mixed gas atmosphere of 95% argon gas and 5% oxygen gas from a sintered body of a mixture of 100 parts of indium oxide, 10 parts of tin oxide and 25 parts of cerium oxide on one side of a film substrate (with a light refractive index nf of 1.66) made of a 125 μm-thick polyethylene terephthalate film (hereinafter referred to as PET film). The first transparent dielectric thin film had a thickness of 32 nm and a surface electrical resistance of $8.5 \times 10^9$ Ω/square.

<Sputtering Conditions>
Target Size: 200 mm ×500 mm
Power: 3.0 kW
Voltage: 450 V
Discharge Time: 1 minute
Degree of Vacuum: 0.5 Pa (Production of Second Transparent Dielectric Thin Film)

$SiO_2$ (with a light refractive index n2 of 1.46) was vapor-deposited at a vacuum degree of $1 \times 10^{-2}$ to $3 \times 10^{-2}$ Pa by an electron-beam heating method to form a 50 nm-thick second transparent dielectric thin film on the first transparent dielectric thin film.

(Production of Transparent Conductive Thin Film)

On the thin $SiO_2$ film, a transparent conductive thin film (with a light refractive index n3 of 2.0) of a complex oxide containing 100 parts of indium oxide and 10 parts of tin oxide was formed by a reactive sputtering method using a mixed gas of 95% argon gas and 5% oxygen gas in a 0.5 Pa atmosphere from a sintered body of a mixture of 100 parts of indium oxide and 10 parts of tin oxide.

Example 2

(Production of First Transparent Dielectric Thin Film)

A transparent hard-coating layer (with a light refractive index of 1.54) was formed on a 25 μm-thick PET film by a process including the steps of mixing 100 parts of an ultraviolet curable resin (KRX571-76NL manufactured by Asahi Denka Kogyo K.K.) and 0.5 parts of a silicone-based leveling agent and diluting them with a solvent so as to form a solution with a solids content of 40%, applying the solution with a No. 16 wire bar so as to give a post-drying thickness of 7 μm, vaporizing the solvent with a drying oven, and then curing the coating by application of ultraviolet light from a high pressure mercury lamp.

A first transparent dielectric thin film was formed using the process of Example 1 except that the PET film with the hard-coating layer was used as the film substrate and that a sintered body of a mixture of 100 parts of indium oxide, 5 parts of tin oxide and 10 parts of cerium oxide was used in the reactive sputtering method so that the first transparent dielectric thin film (with a light refractive index n1 of 2.05) was formed of a complex oxide containing 100 parts of indium oxide, 5 parts of tin oxide and 10 parts of cerium oxide on the hard-coating layer. The first transparent dielectric thin film had a thickness of 35 nm and a surface electrical resistance of $5.7 \times 10^7$ Ω/square.

A second transparent dielectric thin film was then formed on the first transparent dielectric thin film in the same way as in Example 1, and a transparent conductive thin film was also formed in the same way as in Example 1 so that a transparent conductive laminated body was obtained.

(Production of Transparent Conductive Laminated Body Film)

An about 20 μm-thick transparent pressure-sensitive acrylic adhesive layer (made of a mixture of 1 part of an isocyanate crosslinking agent and 100 parts of an acrylic copolymer of 100:2:5 (weight ratio) butyl acrylate, acrylic acid and vinyl acetate) with an adjusted elastic modulus of 10 N/cm² was then formed on the other side of the PET film. A transparent substrate made of a 125 μm-thick PET film was bonded onto the pressure-sensitive adhesive layer to form a transparent conductive laminated body with the structure as shown in FIG. 2.

Comparative Example 1

(Production of First Transparent Thin Film)

A first transparent dielectric thin film was formed using the process of Example 1 except that a sintered body of a mixture of 100 parts of indium oxide and 10 parts of tin oxide was used in the reactive sputtering method so that the first transparent dielectric thin film (with a light refractive index n1 of 2.0) was formed of a complex oxide containing 100 parts of indium oxide and 10 parts of tin oxide. The first transparent thin film had a thickness of 51 nm and a surface electrical resistance of $1.1 \times 10^3$ Ω/square.

A second transparent dielectric thin film was then formed on the first transparent thin film in the same way as in Example 1, and a transparent conductive thin film was also formed in the same way as in Example 1 so that a transparent conductive laminated body was obtained.

Comparative Example 2

(Production of First Transparent Dielectric Thin Film)

A first transparent dielectric thin film was formed using the process of Example 1 except that a sintered body of a mixture of 100 parts of indium oxide, 10 parts of tin oxide and 50 parts of cerium oxide was used in the reactive sputtering method so that the first transparent dielectric thin film (with a light refractive index n1 of 2.2) was formed of a complex oxide containing 100 parts of indium oxide, 10 parts of tin oxide and 50 parts of cerium oxide. The first transparent dielectric thin film had a thickness of 25 nm and a surface electrical resistance of $3.6 \times 10^{13}$ Ω/square.

A second transparent dielectric thin film was then formed on the first transparent dielectric thin film in the same way as in Example 1, and a transparent conductive thin film was also formed in the same way as in Example 1 so that a transparent conductive laminated body was obtained.

Comparative Example 3

(Production of First Transparent Dielectric Thin Film)

A first transparent dielectric thin film was formed using the process of Example 1 except that titanium metal was used in the reactive sputtering method so that the first transparent dielectric thin film (with a light refractive index n1 of 2.35) was formed of titanium oxide. The first transparent dielectric thin film had a thickness of 20 nm and a surface electrical resistance of more than $1 \times 10^{13}$ Ω/square.

A second transparent dielectric thin film was then formed on the first transparent dielectric thin film in the same way as in Example 1, and a transparent conductive thin film was also formed in the same way as in Example 1 so that a transparent conductive laminated body was obtained.

The transparent conductive laminated bodies obtained in the examples and the comparative examples were subject to the evaluation as described below. The results are shown in Table 1.

<Surface Electrical Resistance of Transparent Conductive Thin Film>

The surface electrical resistance (Ω/square) was measured using a Lowrester resistance meter manufactured by Mitsubishi Chemical Co., Ltd. The surface electrical resistance of the transparent conductive thin film was set to be 450 Ω/square, therefore preferably does not vary from 450 Ω/square.

<Optical Properties>

The hue b* was measured using a spectrophotometer UV3150 manufactured by Shimadzu Corporation. The hue b* is an indicator of coloration of transmitted light. As the value of the hue b* increases on the negative side, transmitted light becomes bluer. As the value of the hue b* increases on the positive side, transmitted light becomes yellower. The value of the hue b* is preferably in the range of −2 to 2 so that coloration can be suppressed.

<Sputtering Rate>

Sputtering rates are shown for the first transparent dielectric thin film under the sputtering conditions as described in Example 1. A constant sputtering rate is preferred under the sputtering conditions described in Example 1.

TABLE 1

| | Transparent substrate | | Film substrate | | First Transparent (Dielectric) Thin Film | | | Refractive Index of Second Transparent Dielectric Thin Film (n2) | Refractive Index of Transparent conductive thin film (n3) | Transparent Conductive laminated body Surface Electrical Resistance of Transparent conductive thin film (Ω/square) | Hue b* | Sputtering Rate (nm) |
|---|---|---|---|---|---|---|---|---|---|---|---|---|
| | Substrate (thickness (μm)) | Thickness (μm) | Refractive Index (nf) | Refractive Index (n1) | Material (Weight Ratio) | Surface Electrical Resistance (Ω/square) | | | | | | |
| Example 1 | — | 125 | 1.66 | 2.1 | $In_2O_3/SnO_2/CeO_2$ (100/10/25) | $8.5 \times 10^9$ | | 1.46 | 2.00 | 450 | 0.2 | 32 |
| Example 2 | PET (125) | 25 | 1.66 | 2.05 | $In_2O_3/SnO_2/CeO_2$ (100/5/10) | $5.7 \times 10^7$ | | 1.46 | 2.00 | 450 | 1.1 | 35 |
| Comparative Example 1 | — | 125 | 1.66 | 2.0 | $In_2O_3/SnO_2$ (100/10) | $1.1 \times 10^3$ | | 1.46 | 2.00 | 370 | 6.7 | 51 |

TABLE 1-continued

| | Transparent substrate | | Film | First Transparent (Dielectric) Thin Film | | | Refractive Index of Second Transparent Dielectric Thin Film (n2) | Refractive Index of Transparent conductive thin film (n3) | Transparent Conductive laminated body Surface Electrical Resistance of Transparent conductive thin film (Ω/square) | Hue b* | Sputtering Rate (nm) |
|---|---|---|---|---|---|---|---|---|---|---|---|
| | Substrate (thickness (μm)) | Thickness (μm) | Refractive Index (nf) | Refractive Index (n1) | Material (Weight Ratio) | Surface Electrical Resistance (Ω/square) | | | | | |
| Comparative Example 2 | — | 125 | 1.66 | 2.2 | $In_2O_3/SnO_2/CeO_2$ (100/10/50) | $3.6 \times 10^{13}$ | 1.46 | 2.00 | 450 | 0.6 | 25 |
| Comparative Example 3 | — | 125 | 1.66 | 2.35 | $TiO_2$ | $1 \times 10^{13}>$ | 1.46 | 2.00 | 450 | −0.4 | 20 |

Table 1 shows that in the transparent conductive laminated body of each Example, the first transparent dielectric thin film has a high refractive index, produces a good hue and makes the optical adjustment easy and also has a high resistance value and does not reduce the electrical conductivity of the transparent conductive laminated body. In each Example, the sputtering rate and the productivity are also good. In Comparative Example 1, the first transparent thin film has a low surface electrical resistance and thus affects the surface electrical resistance of the transparent conductive thin film. In Comparative Example 1, the first transparent thin film also has a large thickness and thus degrades the optical properties of the transparent conductive laminated body. In Comparative Example 2, the same material as in the first transparent dielectric thin film of each Example is used, but since the cerium oxide content in Comparative Example 2 is higher than that in each Example, the sputtering rate is low. In Comparative Example 3, the sputtering rate is low, because titanium oxide is used in place of the material for the first transparent dielectric thin film of each Example.

What is claimed is:

1. A transparent conductive laminated body, comprising: a transparent film substrate having a thickness of 2 to 200 μm, and a first transparent dielectric thin film, a second transparent dielectric thin film and a transparent conductive thin film that are formed on one side of the substrate in this order from the side of the substrate, wherein
   the first transparent dielectric thin film is formed by vacuum deposition, sputtering or ion plating and comprises a complex oxide containing 0 to 20 parts by weight of tin oxide and 10 to 40 parts by weight of cerium oxide relative to 100 parts by weight of indium oxide, and
   the relationship: n2<n3≦n1 is satisfied, where n1 is the refractive index of the first transparent dielectric thin film, n2 is the refractive index of the second transparent dielectric thin film, and n3 is the refractive index of the transparent conductive thin film.

2. The transparent conductive laminated body according to claim 1, wherein the first transparent dielectric thin film has a thickness of 10 to 200 nm and a surface electrical resistance of $1 \times 10^6$ Ω/square or more.

3. The transparent conductive laminated body according to claim 1, further comprising a transparent substrate that is bonded by a transparent pressure-sensitive adhesive layer to another side of the transparent film substrate.

4. A method for producing a transparent conductive laminated body, comprising:
   forming a first transparent dielectric thin film, a second transparent dielectric thin film and a transparent conductive thin film on one side of a transparent film substrate having a thickness of 2 to 200 μm in this order from the side of the substrate, wherein
   the first transparent dielectric thin film is formed by vacuum deposition, sputtering or ion plating and comprises a complex oxide containing 0 to 20 parts by weight of tin oxide and 10 to 40 parts by weight of cerium oxide relative to 100 parts by weight of indium oxide, and
   the relationship: n2<n3≦n1 is satisfied, where n1 is the refractive index of the first transparent dielectric thin film, n2 is the refractive index of the second transparent dielectric thin film, and n3 is the refractive index of the transparent conductive thin film.

5. The method according to claim 4, wherein the first transparent dielectric thin film has a thickness of 10 to 200 nm and a surface electrical resistance of $1 \times 10^6$ Ω/square or more.

* * * * *